(12) United States Patent
Hsieh (10) Patent No.: US 10,540,118 B2
(45) Date of Patent: Jan. 21, 2020

(54) DATA STORAGE DEVICE AND METHODS FOR PROCESSING DATA IN THE DATA STORAGE DEVICE (71) Applicant: Silicon Motion, Inc., Jhubei, Hsinchu County (TW)

(72) Inventor: Sung-Yen Hsieh, New Taipei (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days.

(21) Appl. No.: 16/039,613

(22) Filed: Jul. 19, 2018

(65) Prior Publication Data
US 2019/0196743 A1 Jun. 27, 2019

(30) Foreign Application Priority Data

Dec. 22, 2017 (TW) .............................. 106145271 A (51) Int. Cl.
G06F 3/06 (2006.01)
G06F 12/16 (2006.01)
G11C 7/24 (2006.01)

(52) U.S. Cl.
CPC .......... G06F 3/0659 (2013.01); G06F 3/0619 (2013.01); G06F 3/0644 (2013.01); G06F 3/0679 (2013.01); G06F 12/16 (2013.01); G11C 7/24 (2013.01)

(58) Field of Classification Search
CPC .... G06F 3/0659; G06F 3/0619; G06F 3/0679; G06F 3/0644
See application file for complete search history.

(56) References Cited

U.S. PATENT DOCUMENTS

| 2015/0039948 A1* | 2/2015 | Um ..................... G06F 11/0706 |
| | | 714/710 |
| 2015/0103599 A1 | 4/2015 | Kim et al. |
| 2015/0186224 A1 | 7/2015 | Lin et al. |
| 2015/0332770 A1 | 11/2015 | Kim |
| 2016/0216907 A1 | 7/2016 | Chang |
| 2016/0284397 A1 | 9/2016 | Kim et al. |
| 2017/0169883 A1 | 6/2017 | Kwon et al. |

* cited by examiner

Primary Examiner — Mohammed A Bashar
(74) Attorney, Agent, or Firm — McClure, Qualey & Rodack, LLP (57) ABSTRACT A data storage device includes a memory device and a controller. The memory device includes at least an MLC block. The MLC block includes a plurality of physical pages. The controller is coupled to the memory device. When the controller determines that a sudden power-off has occurred during a previous write operation for writing data onto the MLC block, the controller finds a predetermined page that has been attacked by the sudden power-off, double programs the predetermined page and a first page that is directly related to the predetermined page and dummy programs a plurality of second pages that are indirectly related to the predetermined page.

12 Claims, 5 Drawing Sheets

DATA STORAGE DEVICE AND METHODS FOR PROCESSING DATA IN THE DATA STORAGE DEVICE

CROSS REFERENCE TO RELATED APPLICATIONS

This Application claims priority of Taiwan Patent Application No. 106145271, filed on Dec. 22, 2017, the entirety of which is incorporated by reference herein.

BACKGROUND OF THE INVENTION

Field of the Invention

The invention relates to a data processing method that is suitable for a flash memory device and capable of improving the utilization rate and operation performance of the flash memory device.

Description of the Related Art

With the rapid growth of data storage technology in recent years, many data storage devices—such as memory cards manufactured in compliance with the SD/MMC standards, CF standards, MS standards or XD standards, as well as solid state hard drives, Embedded Multi Media Cards (eMMC) and Universal Flash Storage (UFS)—have been used widely for a variety of purposes. Therefore, effective control of access to these data storage devices is an important issue.

In order to improve the access performance of these data storage devices, a novel data processing method, which is capable of improving the utilization rate and operation performance of the memory device when the memory device has been attacked by sudden power-off, is proposed.

BRIEF SUMMARY OF THE INVENTION

A data storage device and methods for processing data stored in a memory device are provided. An exemplary embodiment of a data storage device comprises a memory device and a controller. The memory device comprises at least an MLC block. The SRAM is configured to store a first mapping table. The MLC block comprises a plurality of physical pages. The controller is coupled to the memory device. When the controller determines that a sudden power-off has occurred during a previous write operation for writing data onto the MLC block, the controller finds a predetermined page that has been attacked by the sudden power-off, double programs the predetermined page and a first page that is directly related to the predetermined page and dummy programs a plurality of second pages that are indirectly related to the predetermined page.

An exemplary embodiment of a data processing method, suitable for a data storage device comprising a memory device and a controller, the memory device comprising at least an MLC block, and the MLC block comprising a plurality of physical pages, wherein when sudden power-off has occurred during a previous write operation for writing data onto the MLC block, the method comprises: finding out, by the controller, a predetermined page that has been attacked by the sudden power-off; double programming, by the controller, the predetermined page and a first page that is directly related to the predetermined page; and dummy programming, by the controller, a plurality of second pages that are indirectly related to the predetermined page.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims. It should be understood that the following embodiments may be implemented by software, hardware, firmware, or any combination of the above.

Figure 1A:
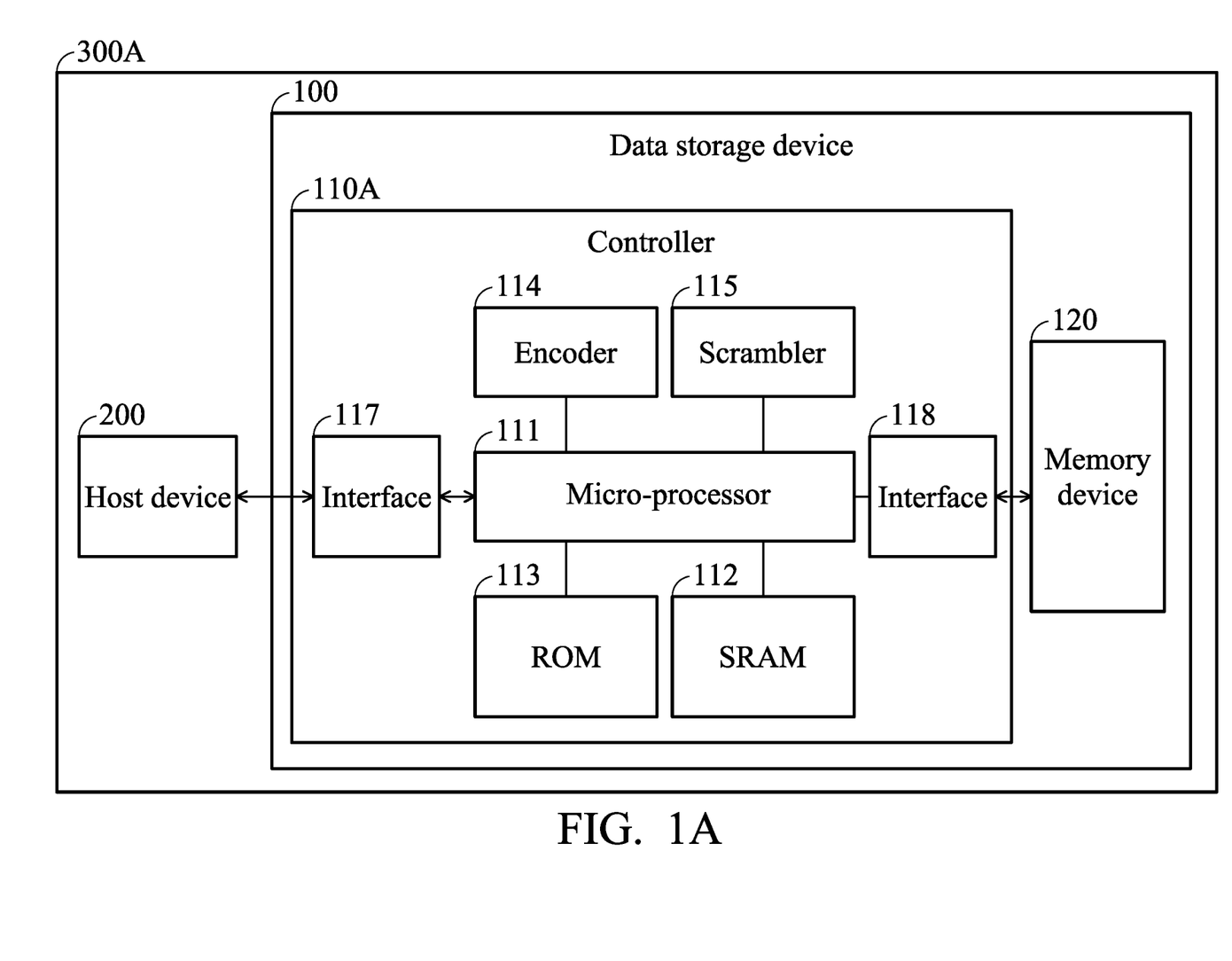
FIG. 1A shows an exemplary block diagram of an electronic device according to an embodiment of the invention.

FIG. 1A shows an exemplary block diagram of an electronic device according to an embodiment of the invention. The electronic device 300A may comprise a data storage device 100 and a host device 200. The electronic device 300A may be a mobile device, such as a smartphone, a smart watch, a tablet computer, etc., but the invention should not be limited thereto.

According to an embodiment of the invention, the data storage device 100 may comprise a controller 110A and a memory device 120. The controller 110A may comprise a micro-processor 111, a Static Random Access Memory (SRAM) 112, a Read Only Memory (ROM) 113, an encoder 114 and a scrambler 115. The memory device 120 may comprise one or more non-volatile memory devices, such as a flash memory.

The host device 200 and the data storage device 100 are connected to each other via a predetermined interface 117. For example, when the data storage device 100 conforms to the Universal Flash Storage (UFS) standards, the host device 200 and the data storage device 100 are connected to each other via the UFS interface, and the data storage device 100 and host device 200 are connected to each other via the predetermined interface 117. In another example, when the data storage device 100 conforms to the eMMC standards, the host device 200 and the data storage device 100 are connected to each other via the MMC interface, and the data storage device 100 and host device 200 are connected to each other via the predetermined interface 117. In addition, the controller 110A and the memory device 120 may be connected to each other via another interface 118.

The ROM 113 is configured to store program codes. The micro-processor 111 is configured to execute the program codes to control access operations of the memory device 120, to utilize the SRAM 112 to perform required data buffering, and to communicate with the host device 200 via the interface 117. The encoder 114 is configured to perform encoding and decoding on the data, and to generate parity check bits utilized for checking and correcting errors according to the content of the data to be written into the memory device 120. The scrambler 115 is configured to scramble (or disturb) the data to be written into the memory device 120 according to the random seeds and to de-scramble the data read from the memory device 1200 according to the corresponding random seeds.

Figure 1B:
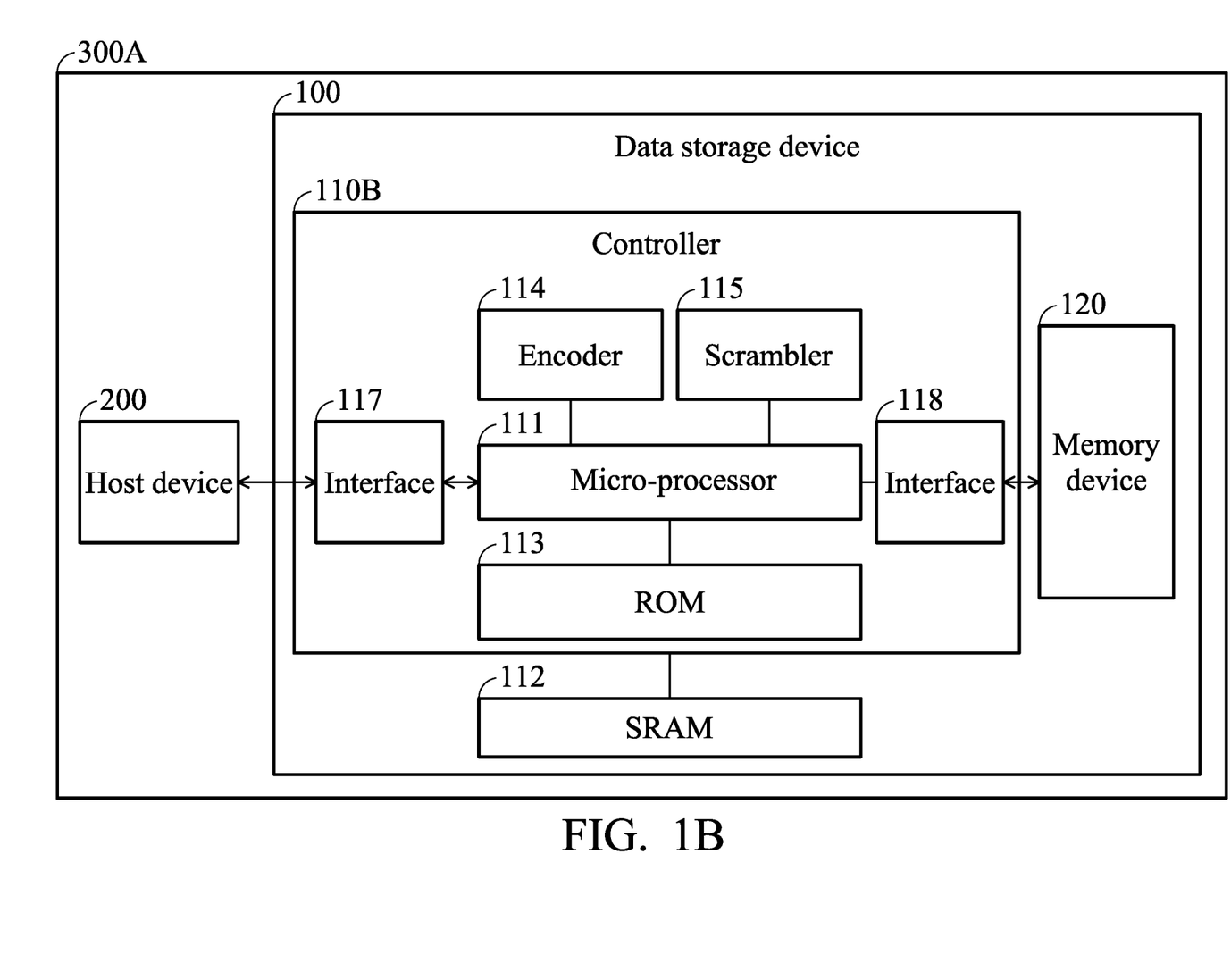
FIG. 1B shows a block diagram of an electronic device according to another embodiment of the invention.

FIG. 1B shows a block diagram of an electronic device 300B according to another embodiment of the invention. In this embodiment, the SRAM 112 is configured outside of the controller 110B and is coupled to the controller 110B.

It should be noted that, to simplify the description, FIG. 1A and FIG. 1B only show the elements related to the invention, and FIG. 1A and FIG. 1B only show two kinds of a plurality of architectures to which the invention can be applied. However, the implementation of the invention is not limited to the elements and architectures shown in FIG. 1A and FIG. 1B.

According to an embodiment of the invention, the memory device 120 may comprise a plurality of memory blocks. The memory blocks may be further grouped into a plurality of Single-level cell (SLC) blocks and a plurality of Multiple-level cell (MLC) blocks. Each memory cell in the SLC block stores one bit data, and each memory cell in the MLC block stores multiple bits of data. For example, according to an embodiment of the invention, each memory cell (that is, each floating gate transistor) in the MLC block stores two bits of data, comprising a least significant bit (LSB) and a most significant bit (MSB). Suppose that the memory block comprises N word lines, where N is a positive integer. Each word line may constitute two pages. Therefore, the memory block may comprise 2*N pages. The least significant bits stored in memory cells on each word line constitutes a first physical page (the LAB page) corresponding to that word line, and the most significant bits stored in the memory cells on each word line constitutes a second physical page (the MAB page) corresponding to that word line. In other words, each physical page of the MLC blocks corresponds to a specific word line. In this embodiment, consecutive page indexes (page numbers) are assigned to two pages that correspond to the same word line. For example, the least significant bits stored in the memory cells on the word line WL(0) constitute page P(0), the most significant bits stored in the memory cells on the word line WL(0) constitute page P(1), etc. However, it should be noted that the invention should not be limited to the exemplary page indexes. In other embodiments, inconsecutive page indexes may also be assigned to the pages correspond to the same word line.

As discussed above, each memory block may comprise a plurality of pages. Generally, in the flash memory device, one page is a minimum data block unit for a write task. The size of a physical page is fixed, and the size of a logical page can be flexibly designed according to the firmware programming requirements.

Generally, data transfer is required in some specific procedures of the memory device. For example, data transfer is required in a garbage collection procedure of a MLC block. When data transfer is performed, the data is transferred (moved) from the source memory block (and written) to the destination memory block. During the process of data transfer, the most unpleasant event is an unexpected power-off or a sudden power-off (SPO).

When the memory device 120 is attacked by the sudden power-off during the process of data transfer, the conventional solution is to give up the part of data that has been completed transferred. That is, the data that has been successfully moved to the destination memory block will be discarded, and the controller will search for another empty memory block to restart the data transfer. For example, when the data storage device 100 powers up, the micro-processor 111 reads some variables (for example, an SPO flag or an SPO count) from the memory device 120 to determine whether the memory device 120 was attacked by the SPO (that is, whether the SPO has occurred). The SPO count may be utilized to accumulate the number of occurrence of the SPO. When the SPO count increases, it means that the last power-off of the memory device 120 was caused by the SPO. In addition, the SPO flag may be utilized to indicate that whether the last power-off of the data storage device 100 was caused by the SPO. For example, when a value of the SPO flag is 1, it means that the SPO has occurred. When the value of the SPO flag is 0, it means that the last power-off of the memory device 120 was triggered by a normal power-off procedure. Every time that the data storage device 100 powers up, the micro-processor 111 may set the value of the SPO flag to 1 and store it in the memory device 120. When the power-off of the memory device 120 was triggered by a normal power-off procedure, the micro-processor 111 may set the value of the SPO flag to 0 during the normal power-off procedure and store it in the memory device 120. Therefore, when the data storage device 100 powers up again after the SPO, the value of the SPO flag will be 1. Conventionally, when the controller determines that there are still some unfinished data transfer, the controller will give up the data that been successfully transferred, select another empty memory block as a new destination memory block, and re-start the data transfer from the beginning.

However, such design will increase the erase count of the memory block, thereby shortening the lifespan of the memory block. In addition, giving up the data that been successfully transferred and selecting another memory block to re-start the data transfer from the beginning will also decrease the operation performance of the memory device 120.

To solve the problems discussed above, a novel data processing method which does not have to give up or discard all of the data that been successfully transferred and is capable of improving the utilization rate and operation performance of the memory device is proposed.

According to an embodiment of the invention, when the controller 110A/110B determines that a sudden power-off has occurred during a previous write operation for writing data onto an MLC block, the controller 110A/110B does not give up this memory block, but finds a physical page (hereinafter called the predetermined page) that has been attacked by the sudden power-off and perform a corresponding sudden power-off recovery (SPOR) procedure instead. The SPOR procedure may comprise finding a suitable physical page and resume the remaining write operation which was left as the SPO occurred.

Figure 2:
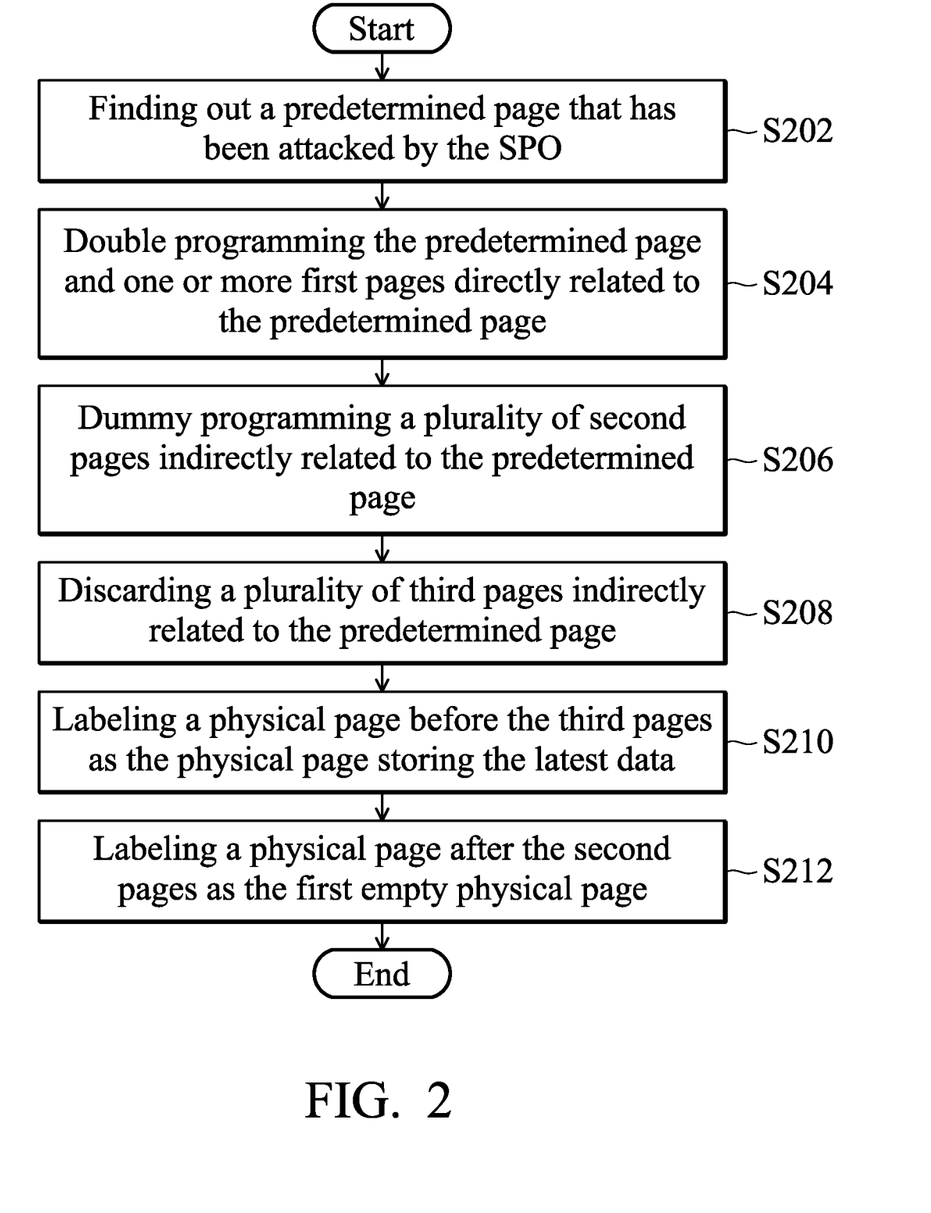
FIG. 2 is an exemplary flow chart of a method for processing data according to an embodiment of the invention.

FIG. 2 shows an exemplary flow chart of a method for processing data according to an embodiment of the invention. In this embodiment, suppose that SPO has occurred during a previous write operation for writing data onto an MLC block. When the data storage device 100 powers up again, the controller 110A/110B may determine whether the SPO has occurred by checking some variables (for example, an SPO flag or an SPO count). If the controller detects that there is any unfinished data transfer of this MLC block when the SPO occurred, the controller 110A/110B may find a predetermined page that has been attacked by the SPO (Step S202). Next, the controller 110A/110B may double program the predetermined page and one or more first pages that is/are directly related to the predetermined page (Step S204). Next, the controller 110A/110B may dummy program a plurality of second pages that are indirectly related to the predetermined page (Step S206). Next, the controller may determine to discard a plurality of third pages that are indirectly related to the predetermined page (Step S208). That is, discarding the data that has been written onto the third pages.

It should be noted that, in the embodiments of the invention, the second pages and the third pages are the physical pages indirectly related to the predetermined page. The term "indirectly related" here means that the corresponding word lines of the second pages and the third pages are disposed adjacent or close to the corresponding word line of the predetermined page in physical space. The difference between the second pages and the third pages is that the second pages are the pages that have not been programmed (the pages that have not been written with data) before the SPO attack, and the third pages are the pages that have been programmed (the pages that have been written with data) before the SPO attack. That is, the write operation for writing data onto the third pages has been completed before the SPO attack. In addition, it should be noted that the order of performing the steps S206 and S208 can be exchanged.

In the embodiments of the invention, the second pages may comprise a plurality of physical pages having consecutive page indexes (page numbers), and the third pages may comprise a plurality of physical pages having consecutive page indexes (page numbers).

Next, the controller 110A/110B may label a physical page right before the starting physical page of the third pages of the MLC block as the physical page which stores the latest and valid data (the latest valid page) (Step S210). For example, the controller 110A/110B may store the page number of this physical page in a variable to point out which physical page stores the latest and valid data. It should be noted that the order of performing the steps S206, S208 and S210 can also be exchanged. For example, the controller 110A/110B may perform the step S208 first, then perform the step S210, and then perform the step S206.

Finally, the controller 110A/110B may label a physical page right after the ending physical page of the second pages of the MLC block as the first empty physical page (Step S212).

Figure 3:
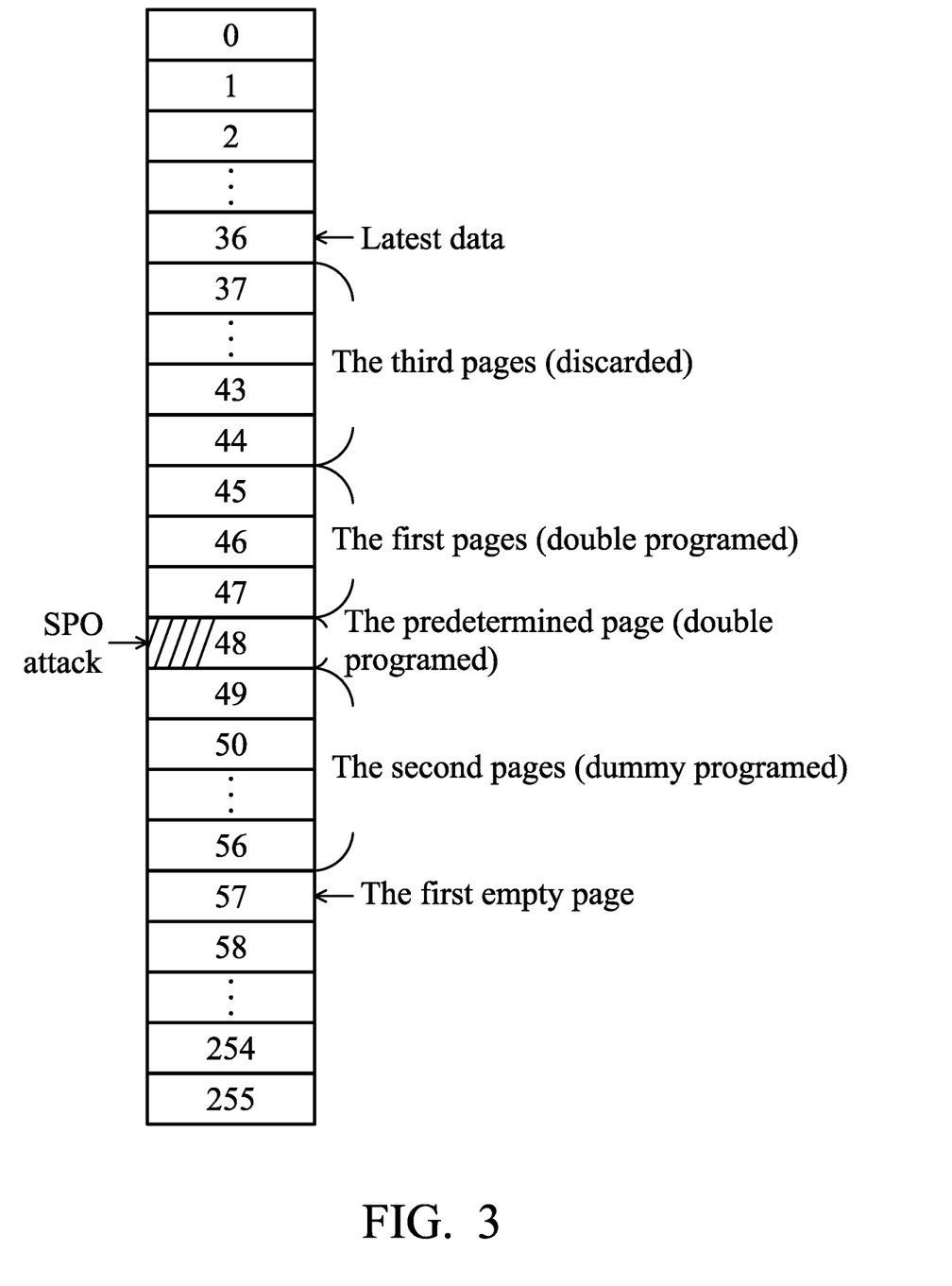
FIG. 3 is an exemplary diagram showing a plurality of physical pages comprised in a memory block according to an embodiment of the invention.

FIG. 3 is an exemplary diagram showing a plurality of physical pages comprised in a memory block according to an embodiment of the invention. Suppose that the memory block 400 is an MLC block and comprises 256 physical pages, where the number showing in the figure is the page index or the page number assigned to each physical page. The page index may be a logical number. That is, the configurations of the physical pages having consecutive page numbers in the physical space do not necessary to be contiguous, or adjacent or close to each other.

Suppose that the SPO has occurred when the controller 110A/110B was writing data onto the $48^{th}$ page, the $48^{th}$ page is the predetermined page as discussed above in this embodiment. When the memory device 120 powers up again, the controller 110A/110B may determine whether the SPO has occurred by checking some variables (for example, the SPO flag or the SPO count). If the controller detects that there is any unfinished data transfer of this MLC block left when the SPO occurred, the controller 110A/110B may find the predetermined page that has been attacked by the SPO first.

According to an embodiment of the invention, the controller 110A/110B may perform binary search on the physical pages comprised in the memory block 400 to find the first empty page. In an embodiment of the invention, the controller 110A/110B may read the data stored in the page being searched and determine whether the page is an empty page based on content of the data. As an example, when the pattern of the read data are all bit '1', or is a predefined pattern, the controller 110A/110B may determine that it is an empty page. In this embodiment, the first empty page is the $49^{th}$ page.

After finding the first empty page, the controller 110A/110B may position the predetermined page that has been attacked by the SPO. In this embodiment, the predetermined page attacked by the SPO is the previous page of the first empty page, that is, the $48^{th}$ page.

When the predetermined page is found, the controller 110A/110B may double program the predetermined page and one or more first pages directly related to the predetermined page. According to an embodiment of the invention, the first page is a pair page of the predetermined page, wherein the predetermined page and its pair page correspond to the same word line. The first page(s) may be one page, or a plurality of pages. As an example, when the first page and the predetermined page correspond to the same write command (for example, the one-shot programing command), the first page comprises one page. As another example, in the embodiment of a memory device 120 comprising two storage planes, the memory blocks corresponding to different storage planes may form a super block, and a one-shot programing command may write data into four pages. Therefore, in this case, the first pages comprise multiple pages, including a pair page of the predetermined page. As shown in FIG. 3, the first pages comprise the $45^{th}$ to $47^{th}$ pages.

Generally, one memory cell of the MLC flash memory stores two data bits. The two data bits respectively belong to one of a pair of strong page and weak page, and the pair of strong page and weak page are the pair page of each other. The strong page means that the program busy time required for writing data onto that page is relative short. On the contrary, the weak page means that the program busy time required for writing data onto that page is relative long. Generally, when the controller writes data into the flash memory, it writes the pages of the flash memory one after one. Therefore, when a group of corresponding strong and weak pages of an MLC flash memory are sequentially written with data, subsequent write operation of the weak page may affect data that has been written onto the strong pages previously.

In addition, generally, the pairing relationship of the strong page and the weak page may be known when manufacturing the memory device, or may be obtained through some predetermined calculation. In this embodiment, the pair page of the predetermined page, the $48^{th}$ page, is the $47^{th}$ page. It should be noted that in the memory design, the strong page and the weak page may be consecutive pages (that is, the page indexes are consecutive numbers), and also may not be consecutive pages. Therefore, the invention should not be limited to any type of pairing relationship.

According to an embodiment of the invention, the controller 110A/110B may double program the predetermined page and the first page(s) by writing a predetermined pattern onto the predetermined page and the first page(s) to overwrite original data stored in the predetermined page and the first page(s). The purpose of double program the predetermined page and the first page(s) are to stabilize the predetermined page and the first page(s).

It should be noted that in an embodiment of the invention, the controller 110A/110B may only program one storage plane in one write operation. Therefore, the pages directly affected by the SPO attack are the predetermined page and the first page (for example, the pair page of the predetermined page). However, the invention should not be limited thereto. In the embodiment shown in FIG. 3, the controller 110A/110B may program two storage planes at the same time in one write operation. For example, two memory planes may be coupled in serial and coupled to the same word line set. Therefore, in a write operation which activating a predetermined word line, the controller 110A/110B may program the pages corresponding to the predetermined word line of these two memory planes at the same time. In this case, the pages that are directly affected by the SPO attacked may comprise the predetermined page and multiple first pages, such as the case shown in FIG. 3. Therefore, in this embodiment, the pages that are directly affected by the SPO attacked may comprise four pages. The controller 110A/110B may double program these four pages by writing a predetermined pattern onto these four pages to overwrite original data stored in these four pages, so as to stabilize these four pages.

Next, the controller 110A/110B may further find a plurality of third pages that are indirectly related to the predetermined page, and may determine to discard the third pages. According to an embodiment of the invention, the pages that are indirectly related to the predetermined page may be the pages that may become unstable or the data stored therein may be distorted due to the SPO attack. According to an embodiment of the invention, suppose that the predetermined page corresponds to a predetermined word line, the third pages may comprise the physical pages that correspond to one or more (or a predetermined number of) word lines adjacent to the predetermined word line. According to an embodiment of the invention, the adjacent word lines may be the word lines with similar word line numbers, or may be the word lines arranged in adjacent positions in the physical space (even if the word line numbers are not similar). In this embodiment, the third pages are the $37^{th}$ page to the $44^{th}$ page.

It should be noted that in the embodiments of the invention, the third pages may not only comprise the physical pages that may become unstable or the data stored therein may be distorted due to the SPO attack (for example, the physical pages that correspond to one or more word lines adjacent to the predetermined word line), but may further comprise the physical pages which are not indirectly affected by the SPO attack (for example, the physical pages that do not correspond to one or more word lines adjacent to the predetermined word line).

Figure 4:
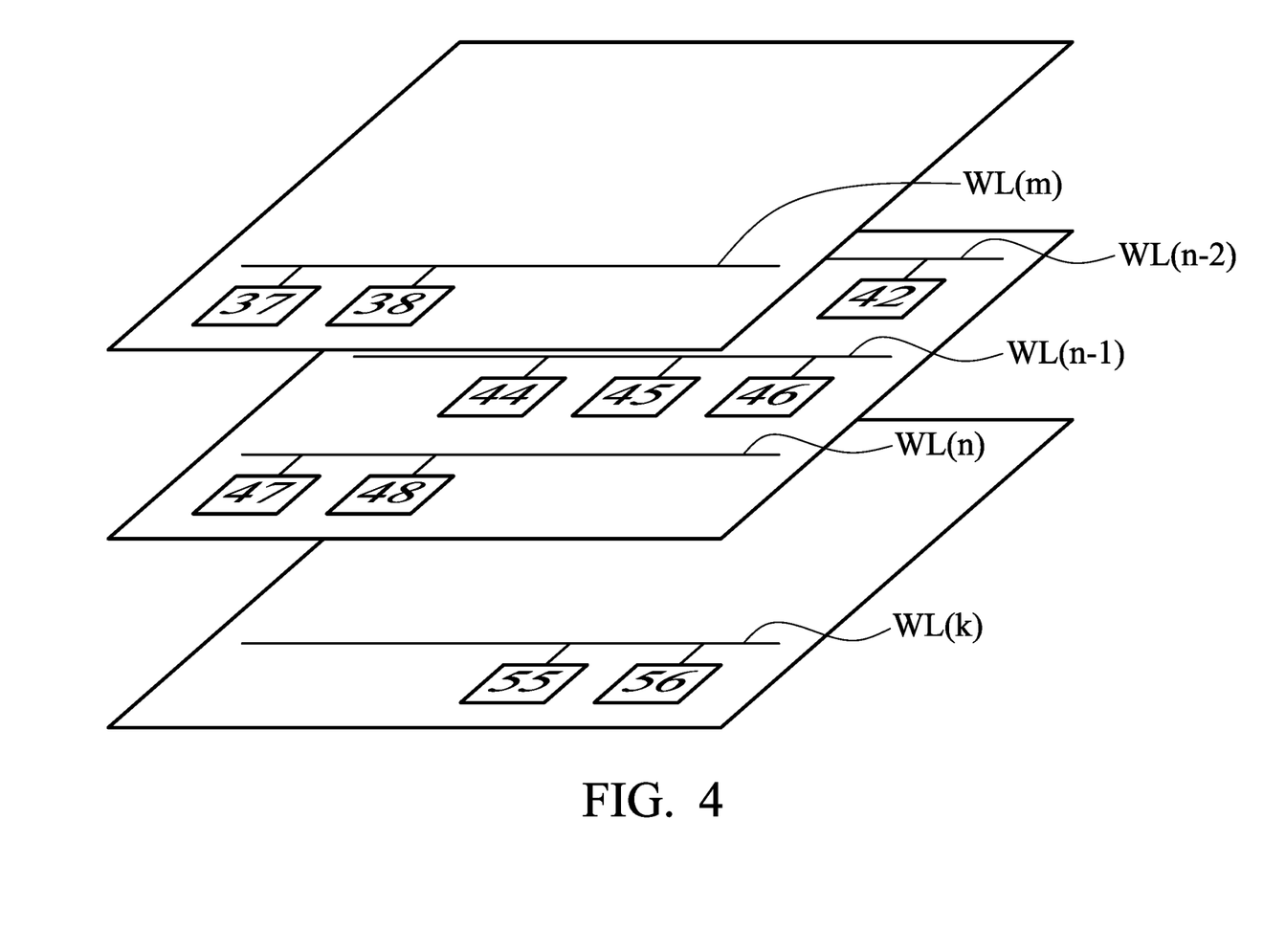
FIG. 4 shows an exemplary diagram of a memory block according to an embodiment of the invention.

FIG. 4 shows an exemplary diagram of a memory block according to an embodiment of the invention. As shown in the figure, a 3D MLC memory block may comprise a plurality of stacked planes (that is, layers) which are spatially stacked. Each layer may contain a plurality of physical pages. Suppose that the predetermined page (the $48^{th}$ page) attacked by the SPO corresponds to the word line WL(n), the pages that are indirectly affected by the SPO attack may comprise the pages that correspond to one or more word lines whose physical positions are adjacent to the WL(n), as an example, the pages corresponding to the word line WL(m) located above the word line WL(n), such as the $37^{th}$ and the $38^{th}$ pages, and the pages corresponding to the previous word line WL(n−1), such as the $46^{th}$ page, where n and m are positive integers.

In addition, because the programs of the pages should be performed consecutively (that is, the pages should be programed one after one based on their page indexes), in this embodiment, the controller 110A/110B may determine to discard the physical pages between the $37^{th}$ page and the $44^{th}$ page (even if the pages, such as the pages corresponding to the word line WL(n−2), not affected by the SPO are included).

According to an embodiment of the invention, the coverage range of the third pages may be known as the memory device is manufactured, or may be obtained through some predetermined calculation or some experiments.

According to an embodiment of the invention, the memory device 120 may store a plurality of mapping tables. For example, the memory device 120 may store at least one logical to physical mapping table (the first mapping table) recording which physical page of which physical MLC block of the memory device 120 that each logical page links to (hereinafter called the recorded physical page and the physical block link). In the embodiments of the invention, the controller 110A/110B may discard the third pages by eliminating the physical page and the physical block links of the third pages recorded in the logical to physical mapping table. As an example, the controller 110A/110B may rewrite content of the physical page links and the physical block links of the third pages recorded in the logical to physical mapping table to 0xFF, or other default value or invalid value. Once the physical page links and the physical block links recorded in the logical to physical mapping table are eliminated, the data stored in the corresponding physical page becomes invalid.

Next, the controller 110A/110B may label the physical page right before the starting physical page of the third pages of the MLC block as the physical page which stores latest and valid data. As an example, the page storing the latest data is the $36^{th}$ page. The controller 110A/110B may record the page number of this physical page in a variable, so as to indicate which physical page stores the latest and valid data. If the SPO occurs again, the controller 110A/110B may start the corresponding data processing from the physical page storing the latest and valid data.

Next, the controller 110A/110B may find other pages (the second pages) that are indirectly related to the predetermined page and dummy program the second pages. According to an embodiment of the invention, the pages that are indirectly related to the predetermined page may be the pages that may become unstable due to the SPO attack. According to an embodiment of the invention, suppose that the predetermined page corresponds to a predetermined word line, the second pages may comprise the physical pages that correspond to one or more (or a predetermined number of) word lines adjacent to the predetermined word line. According to an embodiment of the invention, the adjacent word lines may be the word lines with similar word line numbers, or may be the word lines arranged in adjacent positions in the physical space (even if the word line numbers are not similar). In this embodiment, the second pages are the $49^{th}$ page to the $56^{th}$ page.

As discussed above, in the embodiments of the invention, the second pages and the third pages are all the physical pages that are indirectly related to the predetermined page. The difference between the second pages and the third pages is that the second pages are the pages that have not been programmed (the pages that have not been written with data), and the third pages are the pages that have been programmed (the pages that have been written with data) before the SPO attack.

In addition, it should be noted that in the embodiments of the invention, besides the pages (for example, the $55^{th}$ and $56^{th}$ pages corresponding to word line WL(k) located below the word line WL(n), and the $49^{th}$ and $50^{th}$ pages corresponding to last word line WL(n+1), where k is a positive integer) that may become unstable due to the SPO attack, the second pages may further comprise the pages that are not indirectly affected by the SPO attacked (for example, the physical pages that do not correspond to one or more word lines adjacent to the predetermined word line). Because the programs of the pages should be performed consecutively (that is, the pages will be programed one after one based on the page indexes), in this embodiment, the controller 110A/110B may determine to dummy program the physical pages between the $49^{th}$ page and the $56^{th}$ page (even if the pages not affected by the SPO attacked are included).

According to an embodiment of the invention, the coverage range of the second pages may be known as the memory device is manufactured, or may be obtained through some predetermined calculation or some experiments. In addition, according to an embodiment of the invention, the predetermined page and the first page(s) usually located in the same plane. The predetermined page and the second pages and the predetermined page and the third pages may be located in the same or different planes. However, it should be noted that the invention should not be limited thereto.

According to an embodiment of the invention, the controller 110A/110B may dummy program the second pages by writing dummy data, invalid data or a predetermined pattern onto the second pages. When the second pages are dummy programmed, the controller 110A/110B may label a physical page right after the ending physical pages of second pages of the MLC block as the first empty page. As an example, in this embodiment, the first empty page becomes the $57^{th}$ page. The controller 110A/110B may store the page number of this physical page in a variable to point out which physical page is the first empty page. When the position of the first empty page is determined, the controller 110A/110B may resume the unfinished write operation left before the data storage device last power-off due to the SPO. That is, the controller 110A/110B may continuous to move (transfer) the remaining data from the source memory block (and write) to the destination memory block.

According to an embodiment of the invention, the controller 110A/110B may continue the data transfer from the first physical page, in which the data transfer is not complete, of the source memory block, so as to resume the suspended data transfer. Or, the controller 110A/110B may continue the data transfer from the next page of the physical page, which is corresponding to the physical page of the destination memory block storing the latest data (that is, the $36^{th}$ page in this embodiment), of the source memory block, such that the $36^{th}$ page and the $57^{th}$ page of the current MLC block (the destination memory block) store consecutive data moved from the source memory block.

Via the above-mentioned data processing method, the controllers 110A/110B can quickly find which physical page was attacked by the SPC and perform corresponding data processing, including double programming N pages that are directly affected by the SPO attacked and dummy programming M pages that are indirectly affected by the SPO attack, and discarding R pages that are indirectly affected by the SPO attack, where N, M, and R are positive integers, and N, M, and R may be flexibly adjusted based on the standards of the memory device 120. In addition, the controller 110A/110B may further find an appropriate physical page and resume the unfinished write operations left before the SPO attack. Unlike the conventional design, the proposed data processing method does not give up the MLC block that is attacked by the SPO. Therefore, the proposed data processing method can effectively avoid increasing the erase count of the memory blocks and shortening the lifespan of the memory blocks as in the conventional design, and can further improve the operation performance of the memory device 120.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

The term "coupled" in the specification of the invention generally refers to various direct or indirect electrical connections. While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A data storage device, comprising:
    a memory device, comprising at least an MLC block, the MLC block comprising a plurality of planes that are spatially stacked, and each plane comprising a plurality of physical pages; and
    a controller, coupled to the memory device, wherein when the controller determines that a sudden power-off has occurred during a previous write operation for writing data onto the MLC block, the controller finds a predetermined page that corresponds to a predetermined wordline and has been attacked by the sudden power-off, double programs the predetermined page and one or more first pages by writing a predetermined pattern onto the predetermined page and the one or more first pages to overwrite original data stored in the predetermined page and the one or more first pages, and dummy programs a plurality of second pages by writing dummy data onto the second pages,
    wherein the one or more first pages comprise a pair page of the predetermined page on the predetermined wordline,
    wherein the second pages are empty physical pages among the physical pages of the MLC block, and the empty physical pages correspond to one or more word lines subsequent to the predetermined word line in sequential order.

2. The data storage device as claimed in claim 1, wherein the first page is a pair page of the predetermined page.

3. The data storage device as claimed in claim 1, wherein the controller further discards a plurality of third pages that are indirectly related to the predetermined page, and wherein a write operation for writing data onto the third pages has been completed before the memory device was attacked by the sudden power-off.

4. The data storage device as claimed in claim 3, wherein the memory device further stores a first mapping table configured to record which physical page of which physical block that each logical page links to, and wherein the controller discards the third pages by eliminating the physical page and the physical block links of the third pages recorded in the first mapping table.

5. The data storage device as claimed in claim 3, wherein the the third pages are the physical pages that correspond to one or more word lines prior to the predetermined word line in sequential order.

6. A data processing method, suitable for a data storage device comprising a memory device and a controller, the memory device comprising at least an MLC block, and the MLC block comprising a plurality of planes that are spatially stacked, and each plane comprising a plurality of physical pages, wherein when sudden power-off has occurred during a previous write operation for writing data onto the MLC block, the method comprises:

finding out, by the controller, a predetermined page that corresponds to a predetermined wordline and has been attacked by the sudden power-off;

double programming, by the controller, the predetermined page and one or more first pages by writing a predetermined pattern onto the predetermined page and the one or more first pages to overwrite original data stored in the predetermined page and the one or more first pages; and dummy programming, by the controller, a plurality of second pages by writing dummy data onto the second pages, wherein the one or more first pages comprise a pair page of the predetermined page on the predetermined wordline, wherein the second pages are empty physical pages among the physical pages of the MLC block, and the empty physical pages correspond to one or more word lines subsequent to the predetermined word line in sequential order.

7. The data processing method as claimed in claim 6, wherein the first page is a pair page of the predetermined page.

8. The data processing method as claimed in claim 6, further comprising:

discarding, by the controller, a plurality of third pages that are indirectly related to the predetermined page, wherein write operation for writing data onto the third pages has been completed before the memory device was attacked by the sudden power-off.

9. The data processing method as claimed in claim 8, wherein the memory device further stores a first mapping table configured to record which physical page of which physical block each logical page links to, and wherein the step of discarding the third pages is performed by eliminating the physical page and the physical block links of the third pages recorded in the first mapping table.

10. The data processing method as claimed in claim 8, wherein the third pages are the physical pages that correspond to one or more word lines prior to the predetermined word line in sequential order.

11. The data storage device as claimed in claim 1, wherein the one or more first pages comprise the physical pages on the predetermined wordline.

12. The data processing method as claimed in claim 6, wherein the one or more first pages comprise the physical pages on the predetermined wordline.

* * * * *